United States Patent
Kim et al.

(10) Patent No.: US 9,349,976 B2
(45) Date of Patent: May 24, 2016

(54) PROCESS FOR PREPARING NANOPARTICLE EMBEDDED ELECTRONIC DEVICE

(71) Applicants: SNU R&DB Foundation, Seoul (KR); Global Frontier Center for Multiscale Energy Systems, Seoul (KR)

(72) Inventors: Changsoon Kim, Suwon-si (KR); Hyungchae Kim, Suwon-si (KR); Jongcheon Lee, Suwon-si (KR); Kyuhee Han, Suwon-si (KR); Hyangki Sung, Seoul (KR); Kinam Jung, Seoul (KR); Hoseop Choi, Seoul (KR); Kyungyeon Ha, Seoul (KR); Man Soo Choi, Seoul (KR)

(73) Assignees: SNU R&DB Foundation, Seoul (KR); Global Frontier Center for Multiscale Energy System, Seoul (KR)

( * ) Notice: Subject to any disclaimer, the term of this patent is extended or adjusted under 35 U.S.C. 154(b) by 0 days.

(21) Appl. No.: 14/233,813

(22) PCT Filed: Mar. 4, 2013

(86) PCT No.: PCT/KR2013/001701
§ 371 (c)(1),
(2) Date: Jan. 20, 2014

(87) PCT Pub. No.: WO2014/010807
PCT Pub. Date: Jan. 16, 2014

(65) Prior Publication Data
US 2014/0159030 A1    Jun. 12, 2014

(30) Foreign Application Priority Data
Jul. 13, 2012 (KR) .................. 10-2012-0076888

(51) Int. Cl.
*H01L 51/50* (2006.01)
*H01L 51/42* (2006.01)
(Continued)

(52) U.S. Cl.
CPC ............ *H01L 51/506* (2013.01); *H01L 21/326* (2013.01); *H01L 51/426* (2013.01);
(Continued)

(58) Field of Classification Search
CPC ............ H01L 2924/12041; H01L 2251/5369; H01L 51/506; H01L 51/006; H01L 51/426
USPC ............................... 257/40, 56–57
See application file for complete search history.

(56) References Cited

U.S. PATENT DOCUMENTS 7,563,500 B2 * 7/2009 Busnaina ............... B82B 1/00
428/138
8,213,239 B2 * 7/2012 Halahmi ............... B82Y 10/00
365/185.03
(Continued)

FOREIGN PATENT DOCUMENTS

CN    101262743 A    9/2008
CN    101292372 A    10/2008
(Continued)

OTHER PUBLICATIONS

Messing et al. "Generation of Pd Model Catalyst Nanoparticles by Spark Discharge," J Phys Chem C 114:9257-9263 (2010).
(Continued)

*Primary Examiner* — Tran Tran
(74) *Attorney, Agent, or Firm* — Dardi & Herbert, PLLC; Peter S. Dardi

(57) ABSTRACT

The present invention relates to a process for preparing an electronic device comprising at least one layer selected from the group consisting of a upper electrode layer, a lower electrode layer, an organic layer and an inorganic layer, which comprises a step of introducing a nanoparticle layer or a nano/micro structure layer by adhering charged nanoparticles, before, after or during forming the layer.

7 Claims, 2 Drawing Sheets

(51) Int. Cl.
  *H01L 21/326* (2006.01)
  *H01L 51/56* (2006.01)
  *H01L 51/00* (2006.01)

(52) U.S. Cl.
  CPC .............. *H01L 51/56* (2013.01); *H01L 51/006* (2013.01); *H01L 51/0081* (2013.01); *H01L 2251/5369* (2013.01); *Y02E 10/549* (2013.01); *Y02P 70/521* (2015.11)

(56) References Cited

U.S. PATENT DOCUMENTS

| | | | |
|---|---|---|---|
| 8,240,190 B2* | 8/2012 | Chen | G01N 27/4073 73/23.2 |
| 8,530,000 B2* | 9/2013 | Sinha | 427/421.1 |
| 2005/0237834 A1 | 10/2005 | Bozano et al. | |
| 2006/0017106 A1* | 1/2006 | Suh et al. | 257/347 |
| 2007/0069199 A1 | 3/2007 | Choulis et al. | |
| 2007/0101823 A1 | 5/2007 | Sen et al. | |
| 2008/0220373 A1 | 9/2008 | Choi et al. | |

FOREIGN PATENT DOCUMENTS

| | | |
|---|---|---|
| JP | 2004-207562 | 7/2004 |
| JP | 2008-080461 | 4/2008 |
| KR | 10-2006-0042144 A | 5/2006 |
| KR | 10-2008-0051754 A | 6/2006 |
| KR | 10-0740984 B1 | 7/2007 |
| KR | 10-2008-0010663 A | 1/2008 |
| KR | 10-0907787 B1 | 7/2009 |
| KR | 10-2009-0089787 A | 8/2009 |
| KR | 10-2009-0132488 A | 12/2009 |
| KR | 10-2010-0068777 A | 6/2010 |
| KR | 10-2010-0105023 A | 9/2010 |
| KR | 10-2010-0138089 A | 12/2010 |
| KR | 10-1109195 B1 | 1/2012 |
| KR | 10-2012-0038472 A | 4/2012 |
| WO | 2005/115088 A2 | 12/2005 |

OTHER PUBLICATIONS

Tabrizi et al., "Generation of nanoparticles by spark discharge," J Nanopart Res 11:315-332 (2009).

Vons et al., "Silicon nanoparticles produced by spark discharge," J Nanopart Res 13:4867-4879 (2011).

* cited by examiner

PROCESS FOR PREPARING NANOPARTICLE EMBEDDED ELECTRONIC DEVICE

CROSS REFERENCE TO RELATED APPLICATIONS

This application is a national stage filing of PCT application number PCT/KR2013/001701 filed on Mar. 4, 2013, which claims priority to Korean Patent Application Number 10-2012-0076888 filed Jul. 13, 2012, both of which are hereby incorporated herein by reference.

FIELD OF THE INVENTION

The present invention relates to a process for preparing an electronic device by introducing nanoparticles without damaging layers, which make up an inorganic semiconductor device or an organic semiconductor device.

BACKGROUND OF THE INVENTION

Light emitting diode (LED) is a kind of semiconductor device that can exchange signals or be used as a light source by converting electric signal into infrared rays or light using the characteristics of compound semiconductors.

The LED generating highly efficient light with low voltage has excellent energy saving effect. In recent years, as the brightness problem of the LED, which was a limit of the LED, has been highly improved, the LED is being widely used throughout industry as a whole such as backlight units, electric display boards, indicators, electric home appliances, and various automated machines.

For example, the emission spectrum of a gallium nitride (GaN)-based LED widely ranges from ultraviolet rays to infrared rays, and does not contain environmentally harmful substances such as arsenic (As) and mercury (Hg). Therefore, it is getting highly recognized in the environment-friendly aspect.

As an example of the light emitting diode, the nitride-based light emitting diode has a structure, wherein a buffer layer on the top of a sapphire substrate, a n-type nitride semiconductor layer, an active layer and a p-type nitride semiconductor layer are laminated in order; a part of the n-type nitride semiconductor layer is exposed from the p-type nitride semiconductor layer to the part of the n-type nitride semiconductor layer by mesa-etching; an n-electrode is formed on the top of the exposed n-type nitride semiconductor layer; a transparent electrode is formed on the top of the p-type nitride semiconductor layer and a p-electrode is formed on the top of the transparent electrode.

When applying a voltage to the p-electrode and the n-electrode, holes and electrons flow from the p-type nitride semiconductor layer and the n-type nitride semiconductor layer into an active layer, and recombined on the active layer, resulting in light emitting Problems on improving efficiency of the light emitting diode may reside in: (1) efficiency reduction due to remaining carriers, which are not formed into excitons when the ratio of the hole and the electron are out of the ratio of 1:1 for generating one photon (at the time of bad charge balance), (2) non-radioactive recombination of excitons, and (3) light trapping phenomenon, which is that the light generated in an device does not escape out of the device due to a large refractive index difference between air outside the device and structural materials of the device.

On the other hand, the LED is a device emitting light when the inserted current carriers are recombined at p-n junction or change energy level, but a photo diode is a device using phenomenon, which generates a current or voltage by carriers generated after light irradiation on the p-n junction. Namely, photodiodes are similar to LEDs, but have inverse functions. Photodiodes convert light energy into electric energy, but LEDs convert electric energy into light energy. Photodiodes have characteristics of rapid response speed, wide sensitivity wavelength and good straightness of photocurrent.

In a solar cell device using photodiodes, materials making up an active layer absorb light from outside, thereby producing excitons. The excitons are separated into holes and electrons at the interface between p-type and n-type organic or inorganic semiconductor materials by an electric field applied to the solar cell device, and light can be converted into electricity by collecting the carriers at the electrodes of both ends of the device. Accordingly, the more light is absorbed at the active layer, the more electricity can be produced. But it is difficult to absorb large amount of light due to a very thin active layer in a thin film solar cell. On the contrary, if the active layer is too thick, the excitons formed by light absorbing are recombined and disappeared before reaching the interface of the p-n materials. Accordingly, the excitons cannot be separated into carriers, which are actually used.

Accordingly, structure, which can absorb light on a thin film solar cell as much as possible and efficiently separate the produced excitons as a carrier at the same time, is needed. Further, light trapping, which make the light irradiated to the front side of the solar cell enter the solar cell device without light reflection, and in the rear side, make the light inside the device stay in the device as long as possible without escaping out of the device, should be induced.

In order to solve the above problems, in particular, for improving LED efficiency, a method for controlling energy band gap by adding various material layers for adjusting charge balance, a method for various surface-treatment to LED such as micro lens or surface texturing for reducing the light trapping phenomenon LED, and a method for reducing light trapping by causing many scattered reflection in a device by using plasmon phenomenon have been tried (see Korean Patent Publication No. 10-2010-0068777, Korean Patent Publication No. 10-2012-0038472 and the like).

Further, in order to enhance efficiency of the solar cell, there are studies for improving efficiency of separating exciton as a carrier by largely expanding the interface between a hole transfer layer and an electron transfer layer through bulk heterojunction (BHJ) structure, and a method for controlling an energy band gap by controlling materials. In particular, it is tried to improve hole mobility or electron mobility of an organic solar cell by synthesizing a novel organic material.

PRIOR ART DOCUMENT

Patent Document (Patent Document 1) Korean Patent Publication No. 10-2010-0068777
(Patent Document 2) Korean Patent Publication No. 10-2012-0038472

SUMMARY OF THE INVENTION

The present invention provides a method for easily locating nanoparticles and nano/micro structure on a certain layer of an organic and inorganic semiconductor device without damage of the device, in order to improve efficiency and performance of the organic and inorganic semiconductor device as well as a LED and a solar cell.

The present invention is further provides an electronic device prepared by the said method.

In order to accomplish one object of the present invention, the present invention provides a process for preparing an electronic device comprising at least one layer selected from the group consisting of a upper electrode layer, a lower electrode layer, an organic layer and an inorganic layer, which comprises the step of introducing a nanoparticle layer or a nano/micro structure layer by adhering charged nanoparticles, before, after or during the step of forming the layer.

According to one preferred embodiment of the present invention, the process comprises the steps of:

(1) locating a substrate where an organic layer or an inorganic layer is formed on an electrode in a reactor;

(2) adhering the nanoparticles on the organic layer or the inorganic layer of the substrate by applying voltage to the electrode as introducing the charged nanoparticles in the reactor; and (3) further forming a second organic or inorganic layer on the organic or inorganic layer on which the nanoparticles are adhered to introduce a nanoparticle layer or a nano/micro structure layer in the organic or inorganic layer.

According to one preferred embodiment of the present invention, the charged nanoparticles may be adhered on the organic or inorganic layer in the form of aerosol.

According to one preferred embodiment of the present invention, the entire thickness of the organic or inorganic layer formed in the step (1), and the organic or inorganic layer formed in the step (3) may be tens of nanometers to hundreds of micros. The nanoparticle or the nano/micro structure may be located on a random position in the organic or inorganic layer.

According to one preferred embodiment of the present invention, the voltage applied to the electrode in the reactor may have the opposite polarity with the charged nanoparticles, and have the intensity of 0.5 to 8 kV.

Further, the charged nanoparticles may be selected from the group consisting of latex, polymer particles, oxide particles, metal particles, metal oxide particles, and a mixture thereof, but not limited thereto, and it may be any one, which can be used for improving performance and efficiency of an electronic device.

According to one preferred embodiment of the present invention, the size of the charged nanoparticles may be 1 to 300 nm. In general, the charged nanoparticles may be polydisperse particles, but it also may be monodisperse obtained by using a Differential Mobility Analyzer (DMA) device, or a single material or a mixed material.

The electronic device, which can be prepared by applying the method of the present invention, may be a compound semiconductor light emitting diode (LED), an inorganic solar cell containing silicon or compound semiconductor, an organic light emitting diode (OLED), an organic solar cell (organic photovoltaic), a nonvolatile memory cell or a tandem solar cell, but not limited thereto.

Advantageous Effects of the Invention

According to the present invention, nanoparticles and nano/micro structure can be easily located on a certain layer of an organic and inorganic semiconductor device, for example, on or below of each layer of an upper electrode layer and a lower electrode layer, or in an organic layer/inorganic layer without damaging the device. Therefore, a nanoparticle layer or a nano/micro structure layer can be formed in an electronic device by a simple and efficient method. As a result, efficiency and performance of an organic or inorganic semiconductor electronic device can be improved by using unique characteristics of the nanoparticles or the nano/micro structure. Further, it is expected to solve many problems, which should be overcome for improving the efficiency and performance of the device, by controlling the kind and size of the nanoparticle, the position where the nanoparticle is introduced in the device, and the shape of the nano/micro structure.

BRIEF DESCRIPTION OF DRAWINGS

The above and other objects and features of the present invention will become apparent from the following description of the invention taken in conjunction with the following accompanying drawings, which respectively show.

DETAILED DESCRIPTION OF THE INVENTION

Figure 1:
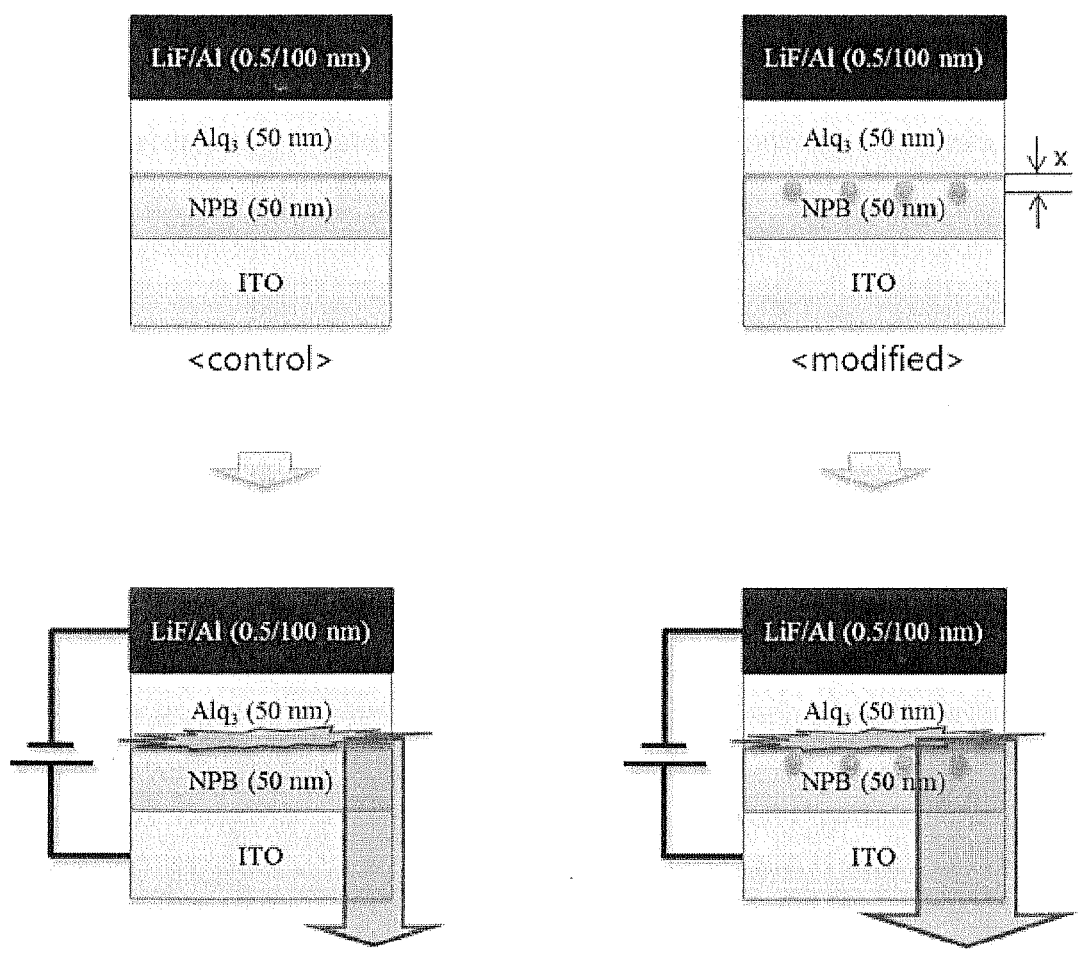
FIG. 1: a diagram showing structure of the organic light emitting diode manufactured in Example and Comparative Example of the present invention.

Hereinafter, the present invention will be described in detail.

In the present invention, nanoparticles and nano/micro structure can be easily located on a certain layer of an organic and inorganic semiconductor device, for example, on or below of each layer of an upper electrode layer and a lower electrode layer, or in an organic layer/inorganic layer without damaging the device by adhering charged particles in the form of aerosol.

Particularly, the present invention can introduce a nanoparticle layer or a nano/micro structure layer into an organic layer or an inorganic layer in an electronic device by a simple and efficient method without damaging the organic layer or the inorganic layer.

The process of the present invention also can form unique nano/micro structure, which is suitable for an inorganic semiconductor device in the inorganic layer. Further, in the case of the organic semiconductor device, the organic matter is vulnerable to solvent or high temperature. Accordingly, it is difficult to introduce nanoparticles or nano/micro structure in the organic semiconductor device by existing methods, which form nano/micro structure and nanoparticles by using photolithography or chemical methods, or thermal evaporation. However, according to the process of the present invention, nanoparticles or nano/micro structure can be easily located between organic layers without damaging of organic matter.

Charged particles can be prepared by passing through a neutralizing device after deposition/condensation, or by spark discharging, ark discharging or electrostatic spray and the like. Materials, which can be used as a precursor material of the charged particles used in the present invention, may be selected from the group consisting of latex, polymer particles, oxide particles, metal particles, metal oxide particles, and a mixture thereof. The deposition/condensation, spark discharging, ark discharging and electrostatic spray may be conducted based on traditional methods.

Depending on use, a substrate, on which an organic layer or an inorganic layer is formed, is located on an electrode of a reactor (deposition chamber), whose body is earthed, and whose inside is equipped with the electrode, and, then, voltage is applied to the opposite polarity with the charged nanoparticles, which will be deposited on the electrode, by using a voltage supplying means.

For example, in the case of using spark discharging, bipolar charged nanoparticles and ions are simultaneously generated by the spark discharging, and then are deposited on the substrate by injecting the particles and ions thereof in the reactor, where the substrate exists, and applying an electric field, regardless of polarity of nanoparticle or ion. A spark discharging chamber is useful for preparing nanoparticles of various materials as disclosed in Korean Patent Publication No. 10-2009-0089787 (Published on Aug. 24, 2009) and the like.

For example, the spark discharging can be conducted by applying a voltage of 1 to 10 kV, more preferably 4 to 10 kV, and in the case of conducting corona discharging at the same time, a voltage of 1 to 10 kV can be applied. Further, it is preferred to apply a voltage of 0.5 to 8 kV with the polarity opposite to the charged particles to the substrate.

The size of the produced nanoparticles may be controlled from 1 to 300 nm depending on use, and in the case of the spark discharging, the size may be 1 to 20 nm preferably, and 3 to 10 nm most preferably.

The metal as the materials forming the nanoparticles may be copper, tin, silver, zinc, platinum, palladium, gold, indium, cadmium, but not limited thereto.

The process of the present invention can easily form the nanoparticle layer or the nano/micro structure layer in the various organic layers or inorganic layers constituting an electronic device without damaging the organic layer or the inorganic layer.

Herein, the term "nanoparticles" refers to particles having an average particle diameter of 1 to 300 nm, and the term "nano/micro structure" refers to a structure, which is formed by 2 or more nanoparticles and has the size of 2 μm or less.

The nanoparticle layer of the nano/micro structure layer means that the nanoparticles or the structure form a discontinuous layer in the organic layer or the inorganic layer, and the thickness thereof is not particularly limited.

In one embodiment of the present invention, the term "electronic device" refers to an electronic part using an organic or inorganic semiconductor device, and examples of the electronic device, which can be used in the embodiment of the present invention, may be a compound semiconductor light emitting diode (LED), an inorganic solar cell containing silicon or compound semiconductor, an organic light emitting diode (OLED), an organic solar cell (organic photovoltaic), a non-volatile memory cell or a tandem solar cell, but not limited thereto.

In the electronic device according to one embodiment of the present invention, other structural devices other than the nanoparticle layer or the nano/micro structure can be formed by using materials and methods, which are traditionally used in the art.

On the other hand, in the case of applying the nanoparticles or the structure to the organic light emitting diode according to one embodiment of the present invention, the organic light emitting diode may have structure containing a positive electrode, a hole transfer layer (HTL), a nanoparticle layer or a nano/micro structure layer on the substrate, an emission layer (EML), an electron transfer layer (ETL), or an negative electrode. Also, other structural devices other than the nanoparticle layer or the nano/micro structure layer can be formed by using materials and methods, which are traditionally used in the art.

For example, an organic layer (for example, N,N'-di (naphthalen-1-yl)-N,N'-diphenyl-benzidine (NPB)) as a hole transfer layer is deposited on a glass substrate coated with ITO through thermal evaporation by using a vacuum thermal deposition device. Then, it is located on an electrode inside a particle deposition device located on a spark deposition device, and then negative (−) voltage is applied.

Then, charged nanoparticles (for example, gold particles) are generated in a particle generator located at the upper part of the spark deposition device by using spark discharging, and then transferred to the lower part of the particle deposition device, where the glass substrate is located, by using an inert carrier gas (for example, nitrogen gas). The positively charged particles among the gold particles transferred to the deposition device are transferred to the glass substrate where negative (−) charge is applied, and then adhered to the surface of the organic layer (NPB) deposited on the upper part of the ITO.

Then, the substrate is transferred again to the vacuum thermal deposition system, and then the same organic layer is further deposited on the surface of the organic layer, where the nanoparticles are adhered, by thermal deposition. Then, an organic layer (for example, 8-hydroxyquinoline aluminum (Alq3)) as an emission layer is deposited by the same method, and then an electron injection layer (for example, LiF) is deposited thereon followed by depositing an electrode (for example, aluminum).

Hereinafter, the present invention will be described in further detail with reference to preparation of an organic layer of an organic light emitting device, and the scope of the present invention cannot be limited thereto in any way.

EXAMPLE 1

Applicable Example of Organic Light Emitting Device

An organic NPB layer as a hole transfer layer was deposited on the glass surface, coated with ITO with 140 nm-thick, to the thickness of 30 nm through thermal deposition by using a vacuum thermal deposition system. The sample was transferred from the vacuum thermal deposition system to a glove box under nitrogen atmosphere, and then located on an electrode inside a particle deposition device which is located at the lower part of a spark deposition device installed in the glove box.

Then, charged gold particles (average particle diameter: about 6 nm) were generated in a particle generator located on the upper part of the spark deposition device by spark discharging (Applied voltage: 5.5 kV), and then transferred to the lower part of the particle deposition device located on the glass substrate by using nitrogen gas (nitrogen gas flow rate: 2 lpm). Then, after applying the voltage of −5.5 kV to the lower electrode, the positively charged particles among the gold particles transferred to the particle deposition device are transferred to the glass substrate, where negative (−) charge was applied, and then adhered to the NPB surface which was deposited on the ITO glass substrate.

Then, the substrate was transferred again to the vacuum thermal deposition system, and then the same NPB layer was further deposited on the
NPB surface, where the gold particles were adhered, by thermal deposition to the thickness of 20 nm. Then, an organic matter Alq3 was deposited thereon by the same method to the thickness of 50 nm as an emission layer, and then LiF was deposited thereon to the thickness of 0.5 nm as an electron injection layer. Then, an aluminum layer was deposited thereon to the thickness of 100 nm as an electrode.

COMPARATIVE EXAMPLE

The thermal deposition method of Example 1 was repeated except for not depositing the gold nanoparticle on the NPB layer by spark discharging, to prepare an organic light emitting device.

EXAMPLES 2 to 4

The thermal deposition method of Example 1 was repeated except following factors: instead of adhering gold particles to the NPB layer deposited to the thickness of 30 nm, and then further depositing the same NPB layer by thermal deposition to the thickness of 20 nm, the layer was deposited to the thickness of 40 nm in advance, the gold particles were adhered, and then the layer was further deposited to the thickness of 10 nm (Example 2); the layer was deposited to the thickness of 20 nm in advance, the gold nanoparticles were adhered; and then the layer was further deposited to the thickness of 30 nm (Example 3); and the layer was deposited to the thickness of 10 nm, the gold nanoparticles were adhered, and then the layer was further deposited to the thickness of 40 nm (Example), to prepare an organic light emitting device.

Figure 2:
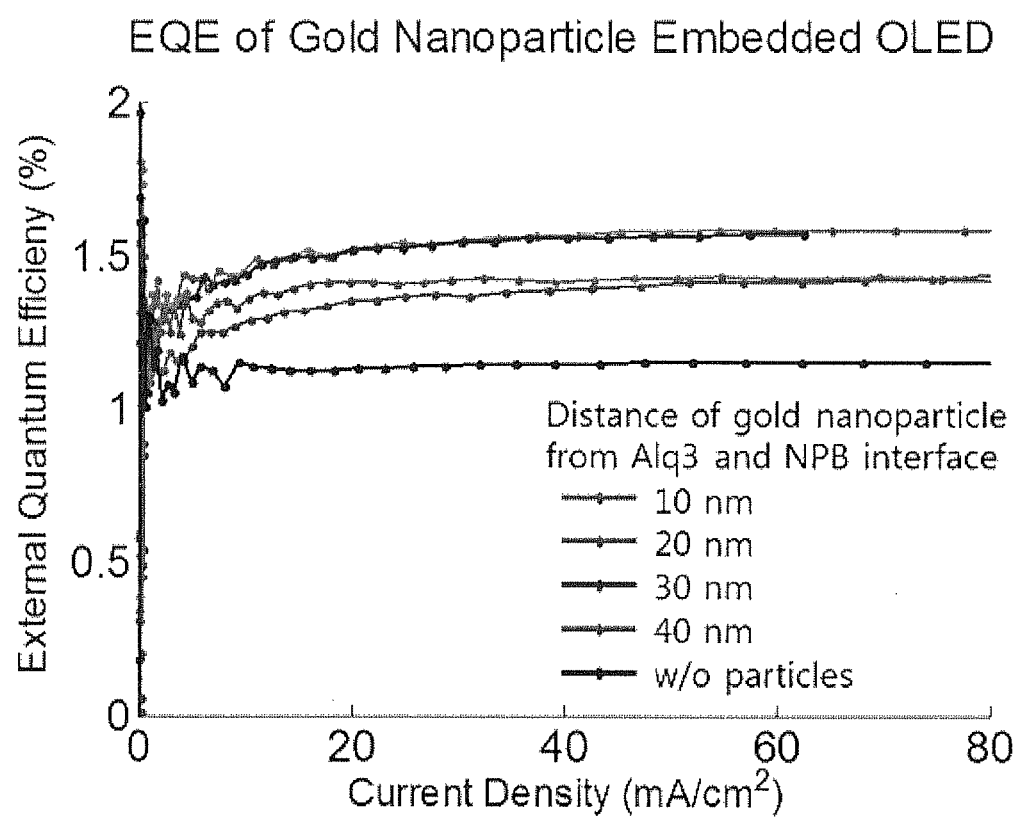
FIG. 2: a graph comparing light emitting efficiency of the organic light emitting diode manufactured in Example and Comparative Example of the present invention.

The organic light emitting devices prepared in Examples and Comparative Example were taken out to the air, and then light emitting efficiency was measured. The results were shown in FIG. 2. According to FIG. 2, it can be found that the light emitting efficiency of the organic light emitting devices of Examples 1 to 4 were much highly improved, compared with Comparative Example wherein the gold nanoparticles were not inserted. And it can be also found that there is a position of the nanoparticle layer, which can optimally enhance the light emitting efficiency in the organic layer even in the same nanoparticle layer.

INDUSTRIAL APPLICABILITY

According to the present invention, nanoparticles and nano/micro structure can be easily located on a certain layer of an organic and inorganic semiconductor device, for example, on or below of each layer of an upper electrode layer and a lower electrode layer, or in an organic layer/inorganic layer without damaging the device. Therefore, a nanoparticle layer or a nano/micro structure layer can be formed in an electronic device by a simple and efficient method. As a result, efficiency and performance of an organic or inorganic semiconductor electronic device can be improved by using unique characteristics of the nanoparticles or the nano/micro structure. Further, it is expected to solve many problems, which should be overcome for improving the efficiency and performance of the device by controlling the kind and size of the nanoparticle, the position where the nanoparticle is introduced in the device, and the shape of the nano/micro structure.

What is claimed is:

1. A process for preparing an electronic device comprising at least one functional organic layer on a substrate, the process comprising:
   (1) locating the substrate with a first functional organic layer on an electrode in a reactor:
   (2) introducing a nanoparticle layer or a nano or micro structure layer by adhering charged nanoparticles in a form of aerosol onto the first functional organic layer by applying a voltage to the electrode while introducing the charged nanoparticles into the reactor; and
   (3) further forming a second organic layer or an inorganic layer over the first functional organic layer on which the charged nanoparticles are adhered so that the nanoparticle layer or a nano or micro structure layer is between the first functional organic layer and the second organic layer or the inorganic layer.

2. The process for preparing an electronic device according to claim 1, wherein voltage applied to the electrode has opposite polarity with the charged nanoparticles, and has an intensity of 0.5 to 8 kV.

3. The process for preparing an electronic device according to claim 1, wherein the charged nanoparticles comprise latex, polymer particles, oxide particles, metal particles, metal oxide particles, or a mixture thereof.

4. The process for preparing an electronic device according to claim 1, wherein the charged nanoparticles have a size from 1 to 300 nm.

5. The process for preparing an electronic device according to claim 1, wherein the electronic device is a compound semiconductor light emitting diode (LED), an inorganic solar cell containing silicon or compound semiconductor, an organic light emitting diode (OLED), an organic solar cell (organic photovoltaic), a non-volatile memory cell or a tandem solar cell.

6. The process for preparing an electronic device according to claim 5, wherein the electronic device is an organic light emitting diode, and the charged nanoparticles are introduced on the organic layer as a hole transfer layer.

7. An electronic device prepared by the method of claim 1.

* * * * *